(12) United States Patent
Xu et al.

(10) Patent No.: US 12,406,867 B2
(45) Date of Patent: Sep. 2, 2025

(54) SPLIT VALVE AIR CURTAIN

(71) Applicant: Taiwan Semiconductor Manufacturing Company, Ltd., Hsinchu (TW)

(72) Inventors: Jia-Wei Xu, Taichung (TW); Yin-Bin Tseng, Hsinchu (TW); Kai-Shiung Hsu, Hsinchu (TW); Chun-Sheng Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 485 days.

(21) Appl. No.: 17/836,612

(22) Filed: Jun. 9, 2022

(65) Prior Publication Data
US 2023/0142009 A1    May 11, 2023

Related U.S. Application Data

(60) Provisional application No. 63/277,037, filed on Nov. 8, 2021.

(51) Int. Cl.
  *H01L 21/67* (2006.01)
  *C23C 16/44* (2006.01)
  *C23C 16/54* (2006.01)
(52) U.S. Cl.
  CPC .... *H01L 21/67167* (2013.01); *C23C 16/4401* (2013.01); *C23C 16/54* (2013.01)

(58) Field of Classification Search
  CPC ............ H01L 21/67167; C23C 16/4401; C23C 16/54
  See application file for complete search history.

(56) References Cited

U.S. PATENT DOCUMENTS

| | | | |
|---|---|---|---|
| 6,623,798 B2 * | 9/2003 | Shin | C23C 16/42 |
| | | | 427/255.393 |
| 8,794,896 B2 * | 8/2014 | Ashizawa | H01L 21/67739 |
| | | | 156/345.31 |
| 10,128,116 B2 * | 11/2018 | Lee | H01L 21/28202 |
| 10,202,691 B2 * | 2/2019 | Karim | H01J 37/32513 |
| 10,236,190 B2 * | 3/2019 | Yan | H01L 21/67017 |
| 10,407,773 B2 * | 9/2019 | LaVoie | C23C 16/4408 |
| 11,440,117 B2 * | 9/2022 | Zhang | H01L 21/681 |
| 12,087,573 B2 * | 9/2024 | Brady | C23C 16/4412 |

(Continued)

FOREIGN PATENT DOCUMENTS

| | | | | | |
|---|---|---|---|---|---|
| CN | 105590881 A | * | 5/2016 | ....... | H01L 21/67126 |
| CN | 107658249 A | * | 2/2018 | ....... | H01L 21/67126 |

(Continued)

*Primary Examiner* — Laura M Menz
(74) *Attorney, Agent, or Firm* — Sterne, Kessler, Goldstein & Fox P.L.L.C.

(57) ABSTRACT

Contamination from outgassing during a deposition process is addressed by a series of equipment enhancements, including throttle valves, a dual air curtain, and a residual gas analysis (RGA) monitor. The dual air curtain can be configured to flow a first gas during wafer processing and a second gas during wafer unloading, to re-direct and capture outgassed species. The dual air curtain and the throttle valves can be programmed in an automated feedback control system that utilizes data from the RGA monitor.

10 Claims, 11 Drawing Sheets

(56) References Cited

U.S. PATENT DOCUMENTS

| | | | | |
|---|---|---|---|---|
| 2001/0040098 | A1* | 11/2001 | Okase | C25D 17/001 |
| | | | | 205/82 |
| 2002/0014205 | A1* | 2/2002 | Shin | C23C 16/4412 |
| | | | | 118/715 |
| 2003/0219536 | A1* | 11/2003 | Shin | C23C 16/54 |
| | | | | 427/255.28 |
| 2006/0207971 | A1* | 9/2006 | Moriya | H01L 21/67775 |
| | | | | 156/345.1 |
| 2007/0130738 | A1* | 6/2007 | Ashizawa | H01L 21/67201 |
| | | | | 438/941 |
| 2013/0344688 | A1* | 12/2013 | Ye | C23C 16/45525 |
| | | | | 438/486 |
| 2017/0352557 | A1* | 12/2017 | Yan | H01L 21/67201 |
| 2018/0108529 | A1* | 4/2018 | Lee | H01L 21/02175 |
| 2021/0098401 | A1* | 4/2021 | Zhang | B23K 3/0623 |
| 2023/0142009 | A1* | 5/2023 | Xu | C23C 16/0272 |
| | | | | 427/255.28 |

FOREIGN PATENT DOCUMENTS

| | | | | | |
|---|---|---|---|---|---|
| CN | 105590881 | B | * | 8/2020 | H01L 21/67126 |
| CN | 107658249 | B | * | 3/2022 | H01L 21/67126 |
| CN | 109906498 | B | * | 4/2024 | G02F 1/133502 |
| KR | 2396498 | B1 | * | 5/2022 | |
| WO | WO-2013192295 | A1 | * | 12/2013 | C23C 16/45525 |
| WO | WO-2018075225 | A1 | * | 4/2018 | G02F 1/133502 |
| WO | WO-2019084386 | A1 | * | 5/2019 | C23C 16/4409 |
| WO | WO-2024064161 | A1 | * | 3/2024 | H01L 21/02381 |

* cited by examiner

SPLIT VALVE AIR CURTAIN

CROSS-REFERENCE TO RELATED APPLICATION

This patent application claims benefit of U.S. Provisional Patent Application No. 63/277,037 filed on Nov. 8, 2021 and titled "Slit Valve Air Curtain," which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (FinFETs). Such scaling down has increased the complexity of semiconductor manufacturing processes.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
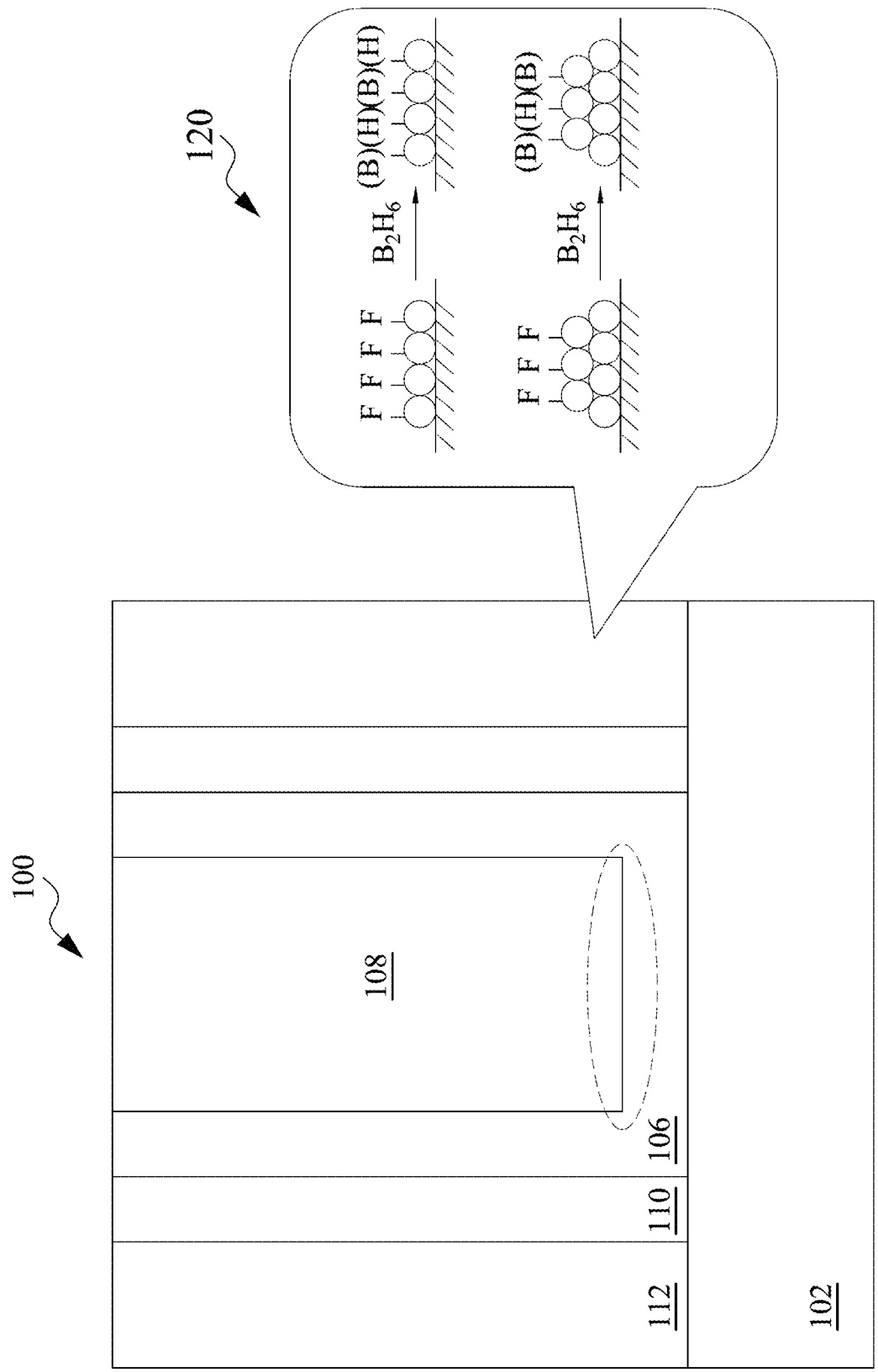
FIG. 1A is a cross-sectional view of a via on a semiconductor wafer, in accordance with some embodiments.
FIG. 1B is an example surface chemical reaction for creating layers of the via shown in FIG. 1A, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of a target value (e.g., ±1%, ±2%, ±3%, ±4%, and ±5% of the target value).

The term "vertical," as used herein, means nominally perpendicular to the surface of a substrate.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

During deposition of films in a process chamber, volatile substances can outgas and coat surfaces of the process chamber with chemical residues. When the coated surfaces cover moving parts of the process chamber, there can be a higher risk of disturbing accumulated residues and causing residue defects on the exposed surfaces of wafers during the semiconductor manufacturing process. Moving parts of the process chamber can include, for example, pressure valves or flow valves that open and close during processing, and entry/exit doors through which wafers pass during load and unload procedures. Through the use of in-situ particle monitoring and preventive measures that avoid or reduce changes in pressure and flow, the probability of generating residue defects can be reduced or eliminated, according to some embodiments of the present disclosure. Such improvements have multiple benefits, by increasing time between equipment maintenance events, improving product quality and yield, and increasing output efficiency.

FIG. 1A illustrates an exemplary film stack of via layers 100 formed on a semiconductor wafer as part of a metal interconnect structure, according to some embodiments. Via layers 100 can be deposited on a substrate 102.

Substrate 102 can be a bulk semiconductor wafer or the top semiconductor layer of a semiconductor-on-insulator (SOI) wafer (not shown), such as silicon-on-insulator. In some embodiments, substrate 102 can include a crystalline semiconductor layer with its top surface parallel to (100), (110), (111), or c-(0001) crystal plane. In some embodiments, substrate 102 can be a glass or plastic substrate. Substrate 102 can be made of a semiconductor material such as, but is not limited to, silicon (Si). In some embodiments, substrate 102 can include (i) an elementary semiconductor, such as germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium carbide (SiGeC), silicon germanium (SiGe), gallium arsenic phosphide (GaAsP), gallium indium phosphide (InGaP), gallium indium arsenide (InGaAs), gallium indium arsenic phosphide (InGaAsP), aluminum indium arsenide (InAlAs), and/or aluminum gallium arsenide (AlGaAs); or (iv) a combination thereof. Further, substrate 102 can be doped with p-type dopants (e.g., boron (B), indium (In), aluminum (Al), or gallium (Ga)) or n-type dopants (e.g., phosphorus (P) or arsenic (As)). In some embodiments, different portions of substrate 102 can have opposite type dopants.

In some embodiments, substrate 102 is a wafer, e.g., a semiconductor wafer, in which transistors or other electronic devices have been fabricated. A top layer of substrate 102 can be, for example, a contact layer that helps to form a low-resistivity electrical contact to underlying devices. Such a contact layer can be made of, for example, cobalt, nickel, or silicides thereof. In some embodiments, substrate 102 further includes, above the contact layer, a liner made of e.g., titanium, titanium nitride, or a combination thereof.

Via layers 100 can include, for example, a seed layer 106, and a bulk metal 108, surrounded by a sidewall insulating material 110 and an inter-layer dielectric (ILD) 112. In some embodiments, seed layer 106 and bulk metal 108 both include the same primary metal component, e.g., tungsten (W). Seed layer 106 can have a thickness between about 27 Å and about 33 Å. ILD 112 can include silicon dioxide ($SiO_2$) or a low-k dielectric material such as, for example, a fluorosilicate glass, a carbon-doped silicon dioxide, a porous silicon dioxide, a porous carbon-doped silicon dioxide, a polyimide, or a polytetrafluoroethylene (PTFE). Via layers 100 are used to illustrate the present disclosure by way of example. However, the present disclosure is not so limited. Other film stacks may pose a similar defect risk as the via layers described herein.

FIG. 1B illustrates formation of seed layer 106, according to some embodiments. Seed layer 106 can be deposited onto substrate 102 under vacuum by, for example, chemical vapor deposition (CVD) or plasma enhanced chemical vapor deposition (PECVD), by exposing substrate 102 to a gas mixture containing boron hexafluoride ($B_2H_6$) and tungsten hexafluoride ($WF_6$) gases. When the fluorine component of $WF_6$ dissociates and reacts chemically with $B_2H_6$, tungsten is deposited onto substrate 102, and the fluorine, boron, and hydrogen components are released as volatile reaction products. Volatilized chemicals may then fill the vacuum chamber and coat interior walls during the reaction phase, before the chamber is evacuated. Seed layer 106 is used to illustrate the present disclosure by way of example. However, the present disclosure is not so limited. Deposition of other seed layers, or other types of layers, may pose a similar defect risk as seed layer 106 that is described herein.

Figure 2:
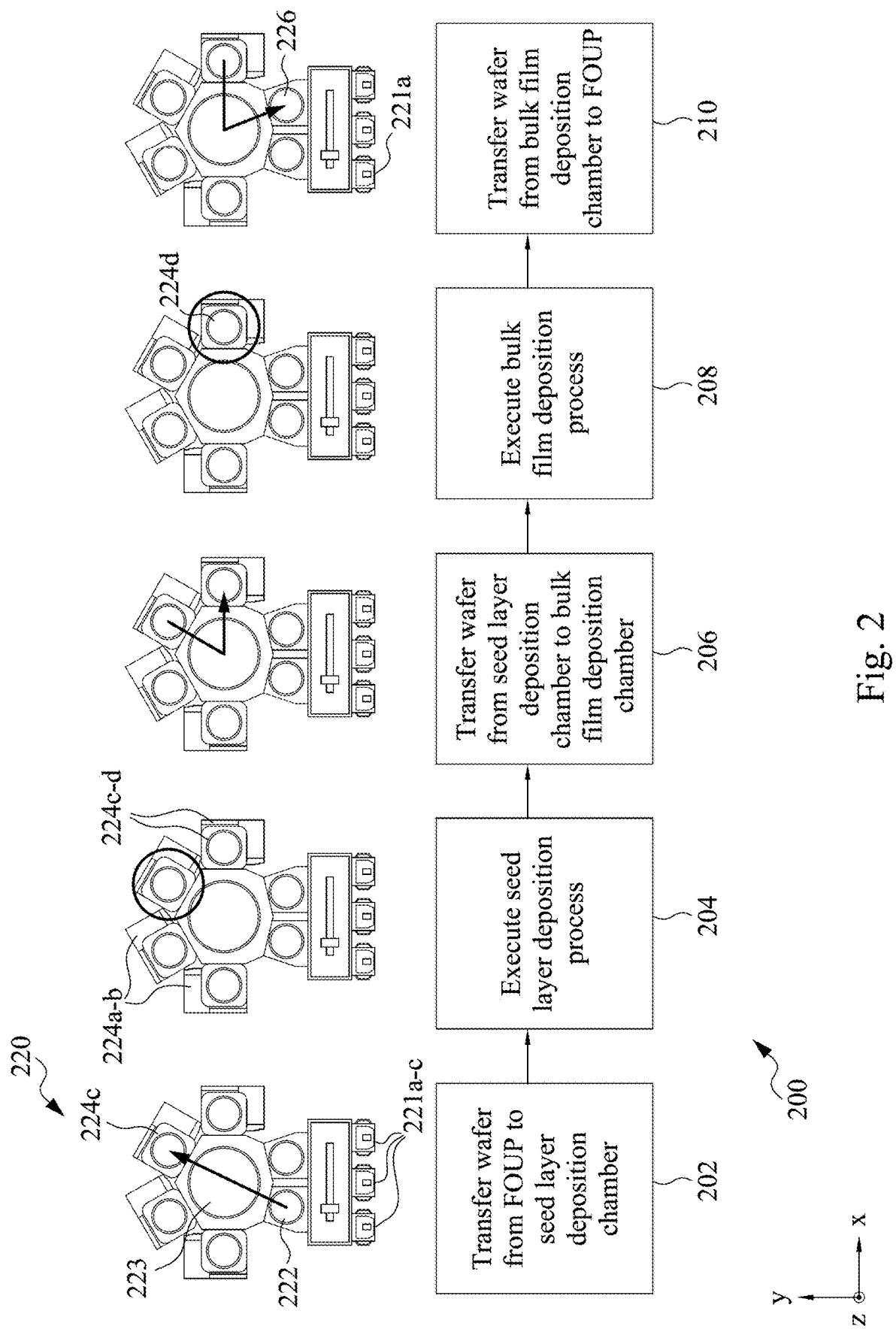
FIG. 2 is an illustrated flow diagram of a method for forming the via shown in FIG. 1A, in accordance with some embodiments.

FIG. 2 shows an exemplary method 200 that can be executed in a multi-chamber deposition equipment set 220, according to some embodiments. Method 200 can be used to form the conductive seed and bulk tungsten layers of the stack of via layers 100 shown in FIG. 1A. A top-down view of multi-chamber deposition equipment set 220 is provided in FIG. 2 for each operation in method 200. In some embodiments, multi-chamber deposition equipment set 220 includes a plurality of load stations 221 (for example, three load stations, 221a-221c, are shown in FIG. 2), an entrance load lock 222, a buffer chamber 223, a plurality of process chambers 224 (for example, four process chambers, 224a-224d, are shown in FIG. 2), and an exit load lock 226. Multi-chamber deposition equipment set 220 can further include one or more robots for automated transfer of wafers to and from the various stations and chambers, or modules. In some embodiments, buffer chamber 223 and process chambers 224 stay under vacuum, while load locks 222 and 226, adjoining both buffer chamber 223 and load stations 221, alternate between atmospheric pressure and vacuum. Process chambers 224 are plumbed with process gases to chemically alter the surface of the wafer being processed, while buffer chamber 223 is used for transferring wafers among process chambers 224. In some embodiments, one or more process chambers 224 can be configured for CVD or for PECVD, with the addition of an energy source that can ionize process gases to create a plasma. In some embodiments, one or more process chambers 224 can be configured as a variant of CVD, such as atomic layer deposition (ALD) or spatial atomic layer deposition (SALD), in which surface reactions create films on the wafer in process, one atomic layer at a time. An exemplary equipment configuration for multi-chamber deposition equipment set 220 is used to illustrate the present disclosure by way of example. However, the present disclosure is not so limited. Other equipment configurations, or other equipment sets used for deposition and/or etching of films on wafers, can pose a similar defect risk as the examples described herein.

In accordance with exemplary method 200, an automated robot can be programmed to transfer a single wafer through multi-chamber deposition equipment set 220. At operation 202, the wafer can be transferred from a front opening unified pod (FOUP) positioned at load station 221a of multi-chamber deposition equipment set 220 to a seed layer deposition chamber 224c via entrance load lock 222 and buffer chamber 223. Entrance load lock 222 can have two doors (not shown) so that a wafer enters entrance load lock 222 at atmospheric pressure, from load station 221a through a first door, then entrance load lock 222 is evacuated, and the wafer exits entrance load lock 222 under vacuum, into buffer chamber 223 through a second door. At operation 204, seed layer 106 is deposited onto the wafer in seed layer deposition chamber 224c. At operation 206, the wafer is transferred from seed layer deposition chamber 224c to bulk layer deposition chamber 224d via buffer chamber 223. At operation 208, bulk metal 108 is deposited onto the wafer in bulk layer deposition chamber 224d. At operation 210, the wafer is transferred from bulk layer deposition chamber 224d via buffer chamber 223 and exit load lock 226, back to the FOUP at load station 221a of multi-chamber deposition equipment set 220. Exit load lock 226 can have two doors (not shown) so that the wafer enters exit load lock 226 from buffer chamber 223 under vacuum, through a first door, exit load lock 226 is pressurized, and the wafer is removed from exit load lock 222, at atmospheric pressure, through a second door for loading back into the FOUP at load station 221a.

Figure 3:
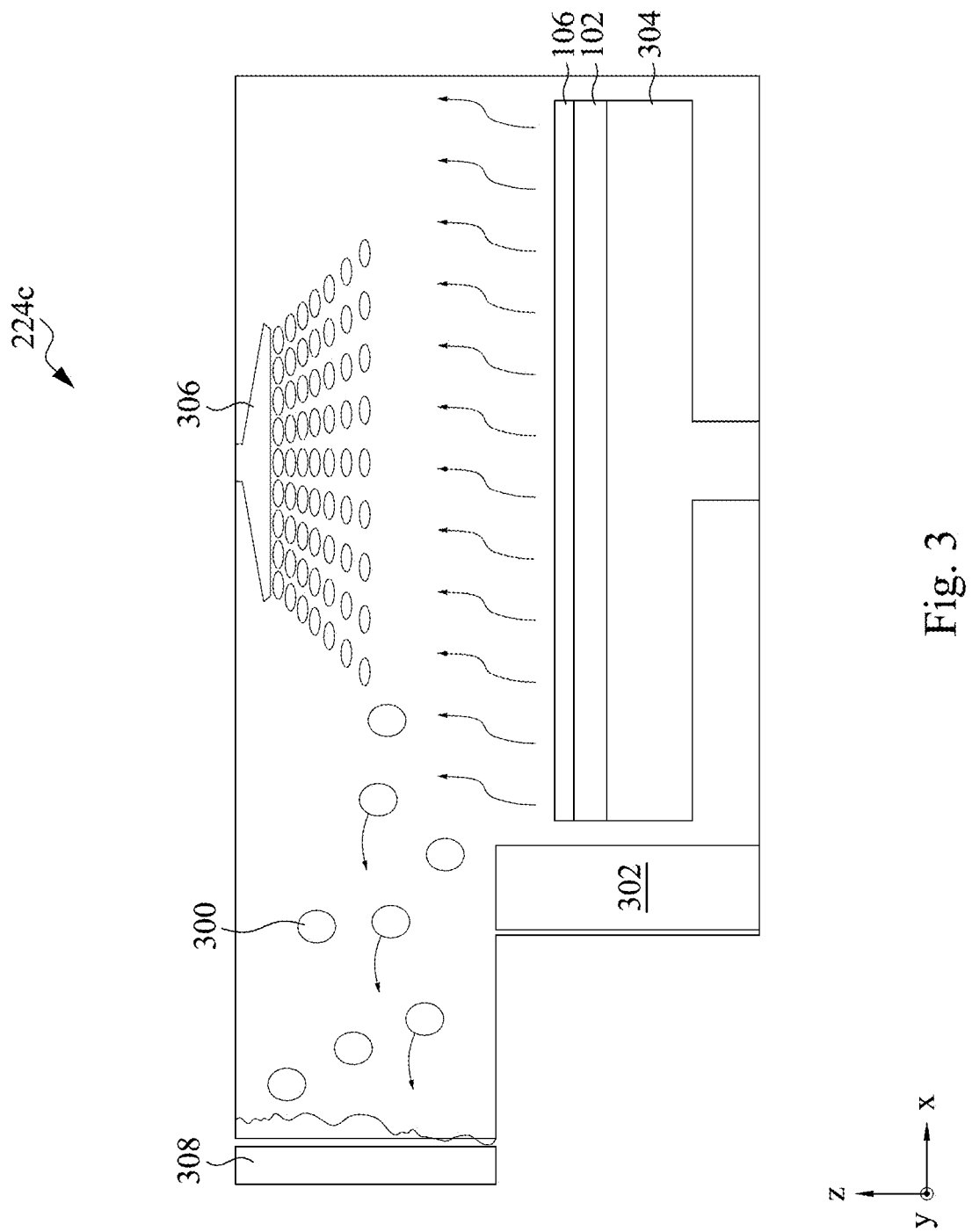
FIG. 3 is a side elevation view of an interior of a processing chamber, in accordance with some embodiments.

Referring to FIG. 2, in operation 204, contaminants 300 are formed within seed layer deposition chamber 224c as shown in FIG. 3. FIG. 3 illustrates an interior view of seed layer deposition chamber 224c, according to some embodiments. Seed layer deposition chamber 224c can have components such as a pump 302, a heated chuck 304, a showerhead 306, and a slit valve 308. Slit valve 308 serves as a doorway for loading and unloading wafers onto heated chuck 304 for processing. Gas phase reactants enter seed layer deposition chamber 224c through showerhead 306, and react at the surface of substrate 102 to form seed layer 106. Residual gases and reaction products exit seed layer deposition chamber 224c via pump 302. In some embodiments, the temperature of heated chuck 304 is between about 270 degrees C. and about 330 degrees C. Heated chuck 304 may catalyze surface reactions, and/or increase a deposition rate of seed layer 106. The temperature of heated chuck 304 can affect the smoothness of the surface of seed layer 106. Heated chuck 304 may also cause evaporation or outgassing of chemicals from the surface of seed layer 106, which chemicals can condense into contaminants 300. In some embodiments, contaminants 300 are as large as about 10 nm in diameter. The composition of contaminants 300 can include tungsten, titanium, and nitrogen, with tungsten being the most prevalent species. Although pump 302 is intended to remove residual gases from seed layer deposition chamber 224c, contaminants 300 that are not captured by pump 302 can accumulate on slit valve 308. After some period of time, when a thick enough layer forms on slit valve 308, motion of slit valve 308 while opening and closing can dislodge contaminants 300, creating a particle source that can impact wafers as they pass through slit valve 308.

Figure 4:
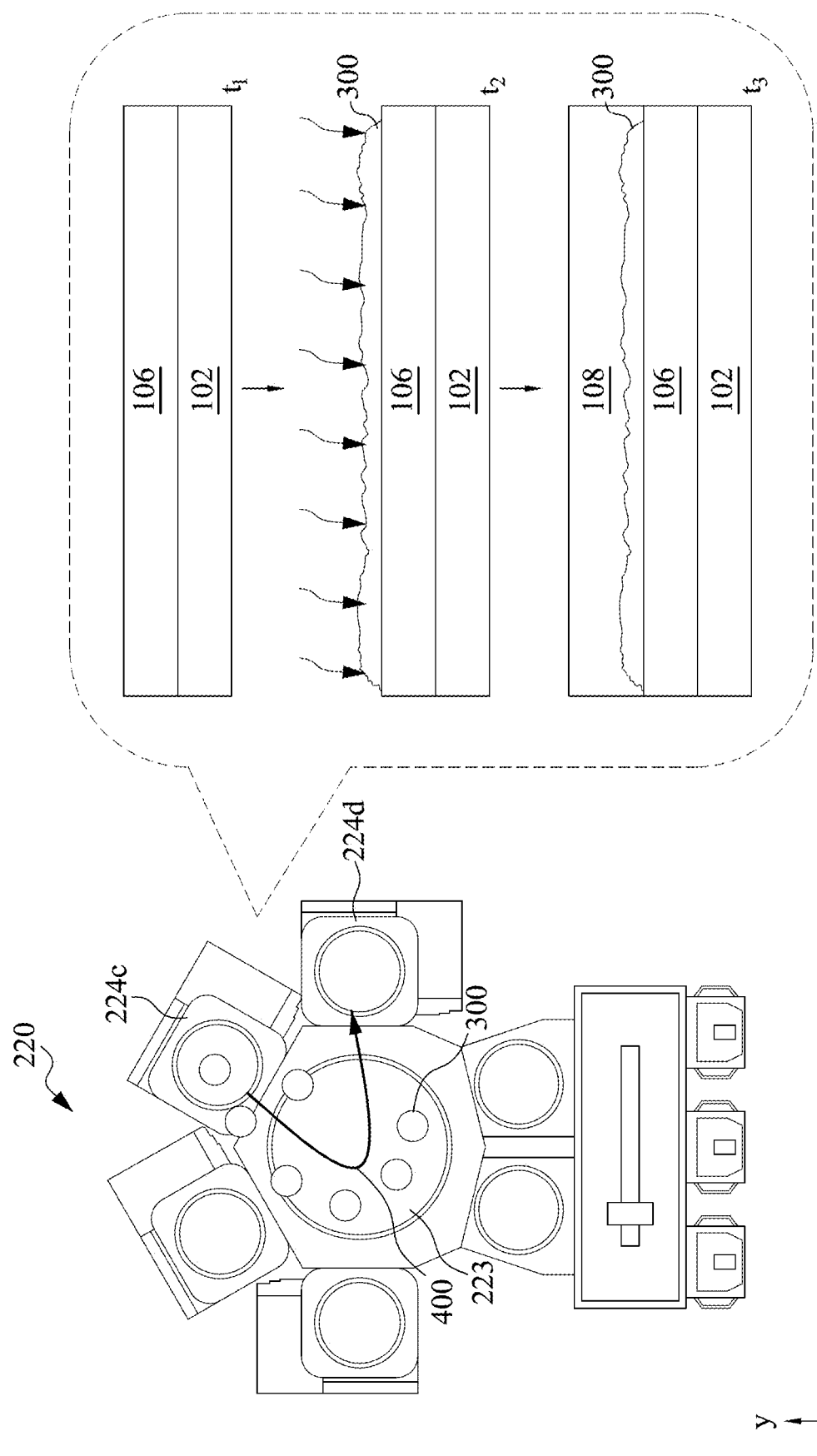
FIG. 4A is a top plan view of an interior of a multi-chamber deposition equipment set, in accordance with some embodiments.
FIG. 4B is a series of cross-sectional views illustrating a process that occurs in the equipment set shown in FIG. 4A, in accordance with some embodiments.

Referring to FIG. 2, in operations 204 and 206, formation and migration of contaminants 300 can occur as shown in FIG. 4A. FIG. 4A shows an enlarged view of multi-chamber deposition equipment set 220 during operations 204 and 206. FIG. 4A further illustrates contaminants 300, which may be generated during operation 204 as described above, migrating out of seed layer deposition chamber 224c, into buffer chamber 223, during wafer transfer to bulk layer deposition chamber 224d in operation 206. As the wafer moves out of seed layer deposition chamber 224c through slit valve 308, in addition to residues being dislodged by motion of slit valve 308, changes in gas flows and/or chamber pressure may further disturb residues and spread contaminants to other areas of multi-chamber deposition equipment set 220. Such residues can impact wafers, causing contaminants 300 to accumulate on the top surface of seed layer 106. Contaminants 300 may also be swept out from seed layer deposition chamber 224c as the wafer passes along a transfer path 400 into buffer chamber 223. In addition, wafers may continue to outgas volatile reaction products from seed layer 106 while they are being transported through buffer chamber 223, thus contaminating buffer chamber 223.

Referring still to FIG. 2, in operations 204 and 206, an effect of contaminants 300 at the interface between seed layer 106 and bulk metal 108 on a wafer is illustrated in FIG. 4B. FIG. 4B shows the wafer at three successive times during operations 204-206. In a top frame of FIG. 4B, at time $t_1$, the wafer is shown after deposition of seed layer 106 has been completed, while the wafer is still in seed layer deposition chamber 224c. In a middle frame of FIG. 4B, at time $t_2$, contaminants 300 land on seed layer 106 as the wafer exits process chamber 224c through slit valve 308 and into buffer chamber 223. In a bottom frame of FIG. 4B, contaminants 300 remain on the surface of the wafer as it continues along transfer path 400, into bulk layer deposition chamber 224d for processing at operation 206. Bulk metal 108 is then deposited over contaminants 300, which intervene between seed layer 106 and bulk metal 108. The presence of contaminants 300 at the interface between the two tungsten layers will thus obstruct electrical contact at the interface and will introduce via resistance that can result in reduced device performance.

Figure 5:
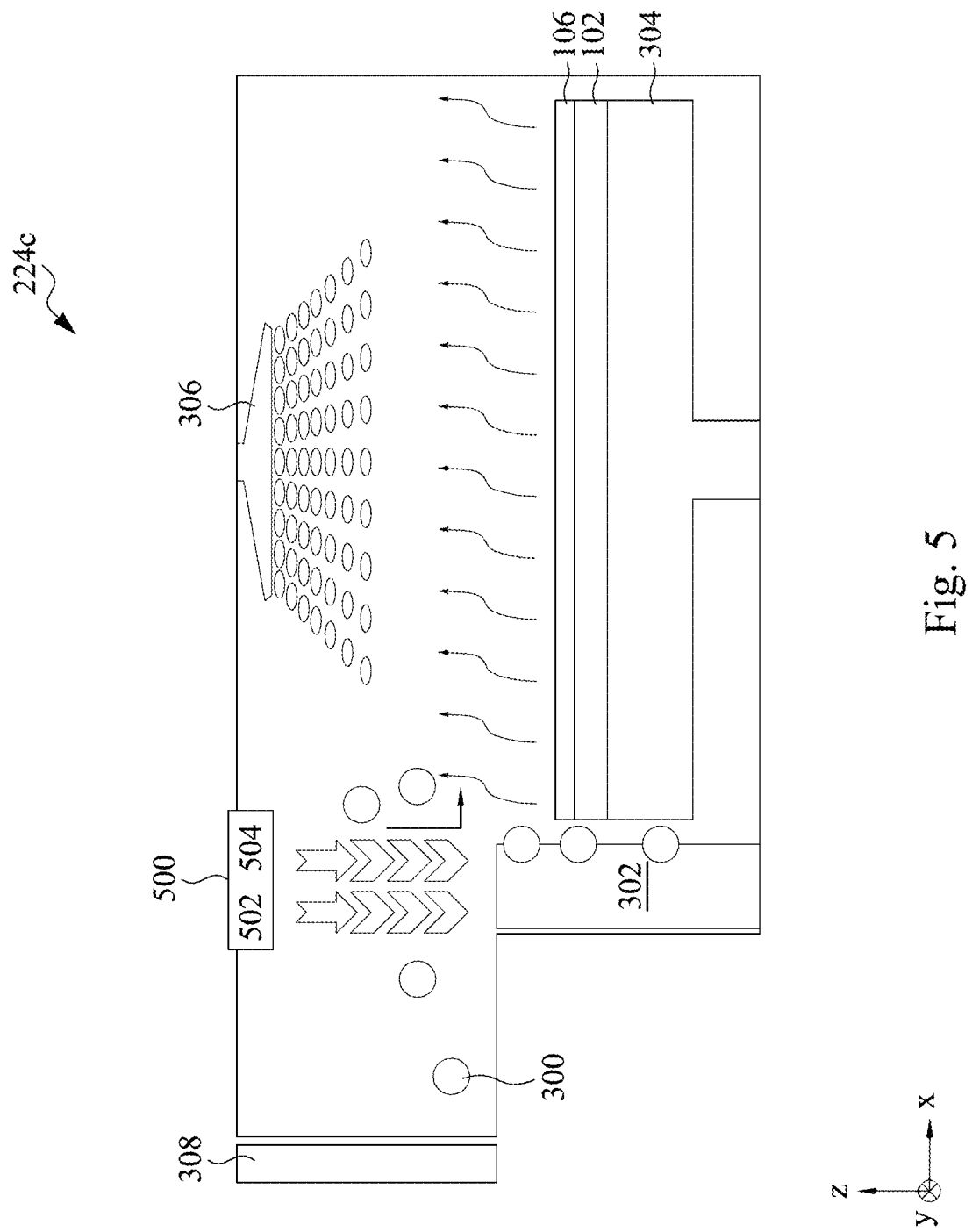
FIG. 5 is a side elevation view of an interior of a processing chamber with a dual air curtain, in accordance with some embodiments.

FIG. 5 illustrates an interior view of seed layer deposition chamber 224c shown in FIG. 3, following implementation of a dual air curtain 500, according to some embodiments. Dual air curtain 500 can be disposed between slit valve 308 and pump 302, so that wafers pass through dual air curtain 500 while loading and unloading from seed layer deposition chamber 224c. When it is positioned above pump 302, dual air curtain 500 produces a region of laminar flow that separates the processing area of seed layer deposition chamber 224c between heated chuck 304 and showerhead 306 from the wafer transfer area near slot valve 308. Dual air curtain 500 can be designed to flow first and second inert gases, 502 and 504, respectively at flow rates in the range of about 500 standard cubic centimeters per minute (sccm) to about 1000 sccm. In some embodiments, nitrogen gas ($N_2$) is used as first inert gas 502 and argon (Ar) us used as second inert gas 504. Alternatively, other inert gases, e.g., helium (He) or oxygen ($O_2$), can be used. In some embodiments, the same gas can be used as both first and second inert gases 502 and 504.

Dual air curtain 500 can alter the motion of contaminants 300 by directing outgassed reaction products toward pump 302 for removal from seed layer deposition chamber 224c. Dual air curtain 500 therefore can prevent contaminants 300 from accumulating on slit valve 308. When only a thin layer of contaminants 300 accumulates on slit valve 308, the thin layer is more likely to stay intact. Thus, the likelihood of flaking and causing defects on processed wafers is lowered. In addition, the presence of dual air curtain 500 increases pressure inside seed layer deposition chamber 224c, which allows increasing pressure in the buffer chamber to balance the chamber pressure and prevent contaminants from rushing out of seed layer deposition chamber 224c during wafer transfer. In some embodiments, the buffer chamber pressure can be set to about 250 mTorr.

Figure 6A:
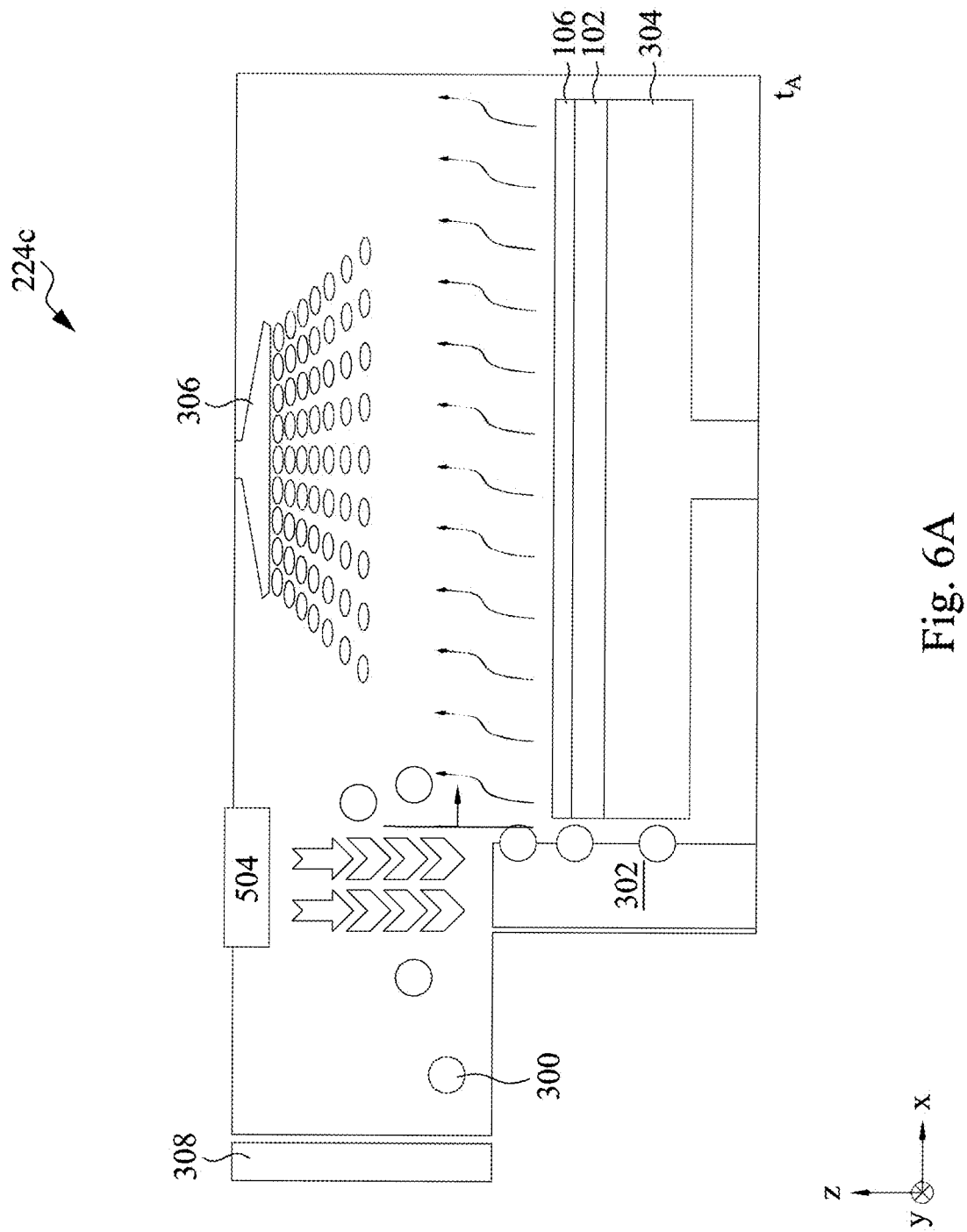
FIG. 6A is a side elevation view of the processing chamber of FIG. 5 during processing and while a slit valve is closed, in accordance with some embodiments.
Figure 6B:
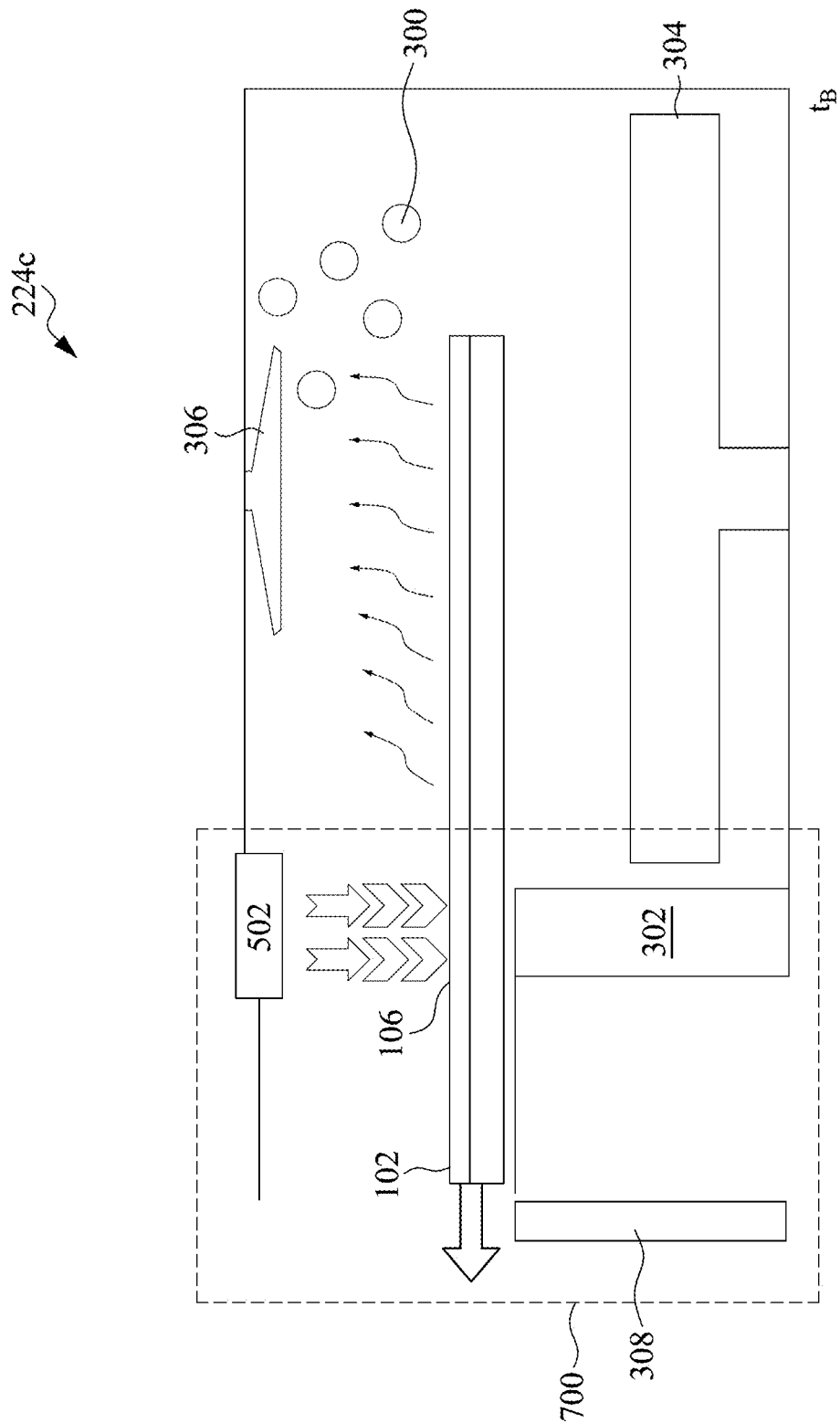
FIG. 6B is a side elevation view of the processing chamber of FIG. 5 during wafer unloading and while a slit valve is open, in accordance with some embodiments.

Referring to FIGS. 6A and 6B, dual air curtain 500 can be implemented to flow different inert gases at different times, in accordance with some embodiments. FIG. 6A shows an operation of dual air curtain 500 at time $t_A$ when a wafer is present on heated chuck 304 and is being processed in seed layer deposition chamber 224c, while slit valve 308 is closed. At time $t_A$, dual air curtain 500 can be programmed to initiate flow of second inert gas 504, e.g., Ar, to direct reaction byproducts and contaminants 300 toward pump 302. As chemicals outgas from the surface of seed layer 106, dual air curtain 500 blocks motion of volatilized species from contaminating slit valve 308 or migrating to buffer chamber 123.

FIG. 6B shows an operation of dual air curtain 500 at time $t_B$ when a wafer is being unloaded from seed layer deposition chamber 224c and slit valve 308 is open. At time $t_B$, dual air curtain 500 can be programmed to turn off the flow of second gas 504 and turn on the flow of first inert gas 502, e.g., $N_2$, to direct reaction byproducts and contaminants 300 toward pump 302. As the wafer is transported out of the chamber towards open slit valve 308, the flow of inert gas 502 through dual air curtain 500 sweeps volatilized species from the surface of seed layer 106, confining contaminants 300 to the chamber, where they can be removed by pump 302.

In some embodiments, different gases can be plumbed to dual air curtain 500, and flow control can be tailored to specific processes other than the example of depositing seed layer 106. For example, dual air curtain 500 can be programmed to flow any combination of first and second inert gases at various times, as needed for the process that is being used in the chamber. In some embodiments, dual air curtain 500 can be implemented on other types of semiconductor process equipment with etching chambers instead of, or in addition to, deposition chambers. In some embodiments, dual air curtain 500 can be implemented on other platforms that may not include vacuum chambers, such as a solvent station for a lithography track where outgassing of volatile solvent chemicals can pose a similar problem to the outgassing described herein.

Figure 7:
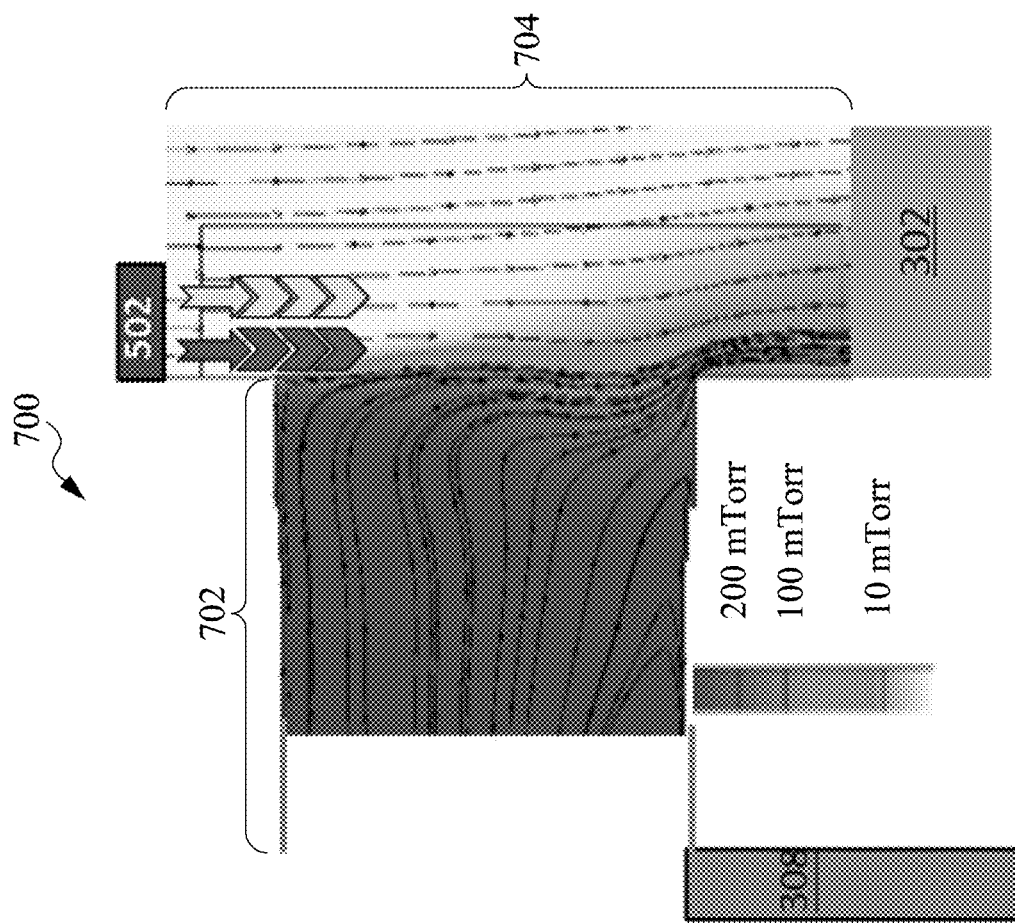
FIG. 7 is a simulated pressure map associated with a dual air curtain, in accordance with some embodiments.

FIG. 7 shows a magnified view of dual air curtain 500 in operation, with first inert gas 502 providing laminar flow. FIG. 7 corresponds to region indicated in FIG. 6B by a dotted line box 700, in which dual air curtain 500 is implemented on seed layer deposition chamber 224c, as described above with respect to FIG. 6B. In FIG. 7, the wafer is not in transit, allowing for laminar flow to proceed unobstructed. FIG. 7 shows simulated pressure gradients in the vicinity of slit valve 308, defined in FIG. 7 as slit valve channel 702. FIG. 7 also shows simulated pressure gradients in a laminar flow region 704 between dual air curtain 500 and the inlet of pump 302.

In FIG. 7, regions of lowest pressure are in laminar flow region 704 and to the right of laminar flow region 704, where the pressure can be less than 100 mTorr. A medium pressure region exists where slit valve channel 702 joins laminar flow region 704, on the left side of laminar flow region 704, where the pressure can be in the range of about 100-150 mTorr. The highest pressures are in slit valve channel 702, farthest away from pump 302, where pressure values can be greater than about 200 mTorr.

Figure 8:
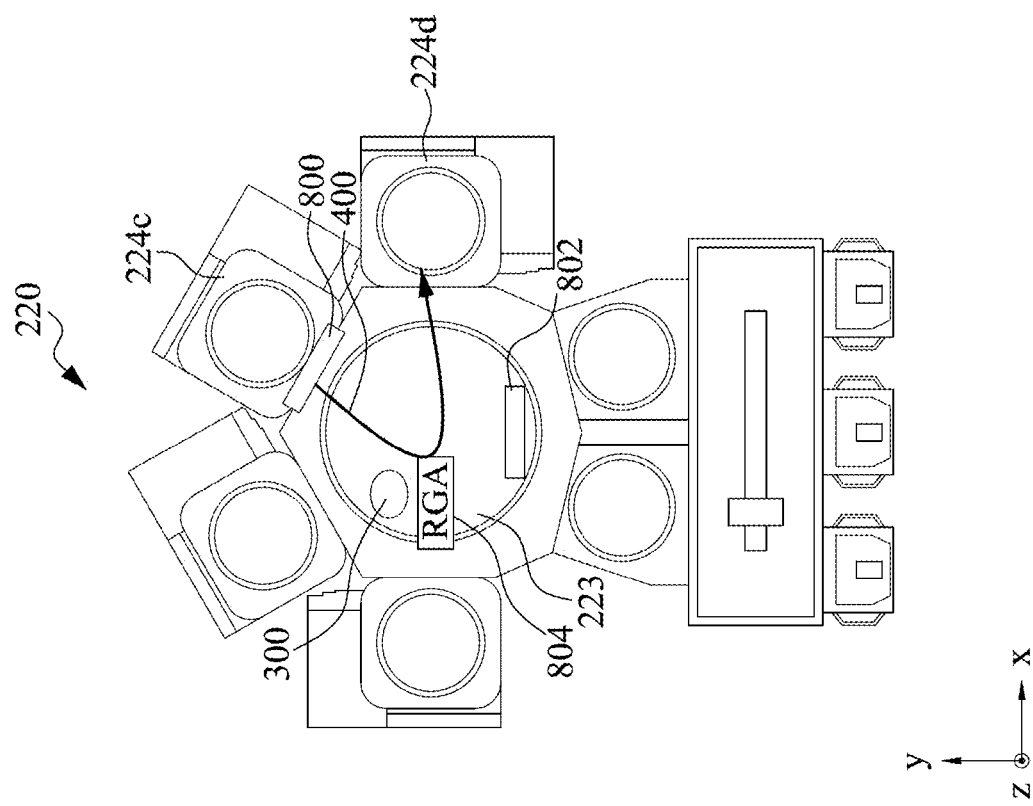
FIG. 8 is a top plan view of an interior of a multi-chamber deposition equipment set with hardware enhancements for reducing contamination, in accordance with some embodiments.

FIG. 8 shows the multi-chamber deposition equipment set 220 of FIG. 4A, implemented with additional hardware solutions to further reduce contamination from outgassing due to deposition of seed layer 106, according to some embodiments. Additional hardware solutions shown in FIG. 8 include a chamber throttle valve 800 for improving control of pump 302, a buffer chamber throttle valve 802 for regulating pressure in buffer chamber 223, and a residual gas analyzer (RGA) monitor 804 installed in buffer chamber 223. Additionally or alternatively, RGA monitor 804 can be installed in other chambers of multi-chamber deposition equipment set 220. RGA monitor 804 measures gas composition of contaminants 300 using mass spectrometry. When installed in buffer chamber 223, RGA monitor 804 can act as an in-situ process monitor to help determine, from the composition of detected contaminants, which chamber of multi-chamber deposition equipment set 220 is the source of detected contaminants.

Throttle valves 800 and 802 can be configured separately, or in a coordinated fashion, to regulate a differential pressure between buffer chamber 223 and a chamber of multi-chamber deposition equipment set 220 with slit valve 308, e.g., seed deposition chamber 224c. With improved pressure regulation provided by throttle valves 800 and 802, changes in pressure can be avoided, reducing the probability of disturbing residue buildup on slit valve 308. In addition, the action of pump 302 and a separate buffer chamber pump (not shown) can be varied using throttle valves 800 and 802, respectively, according to process needs, to more quickly evacuate volatilized species, thereby preventing residues from forming on equipment surfaces.

Figure 9:
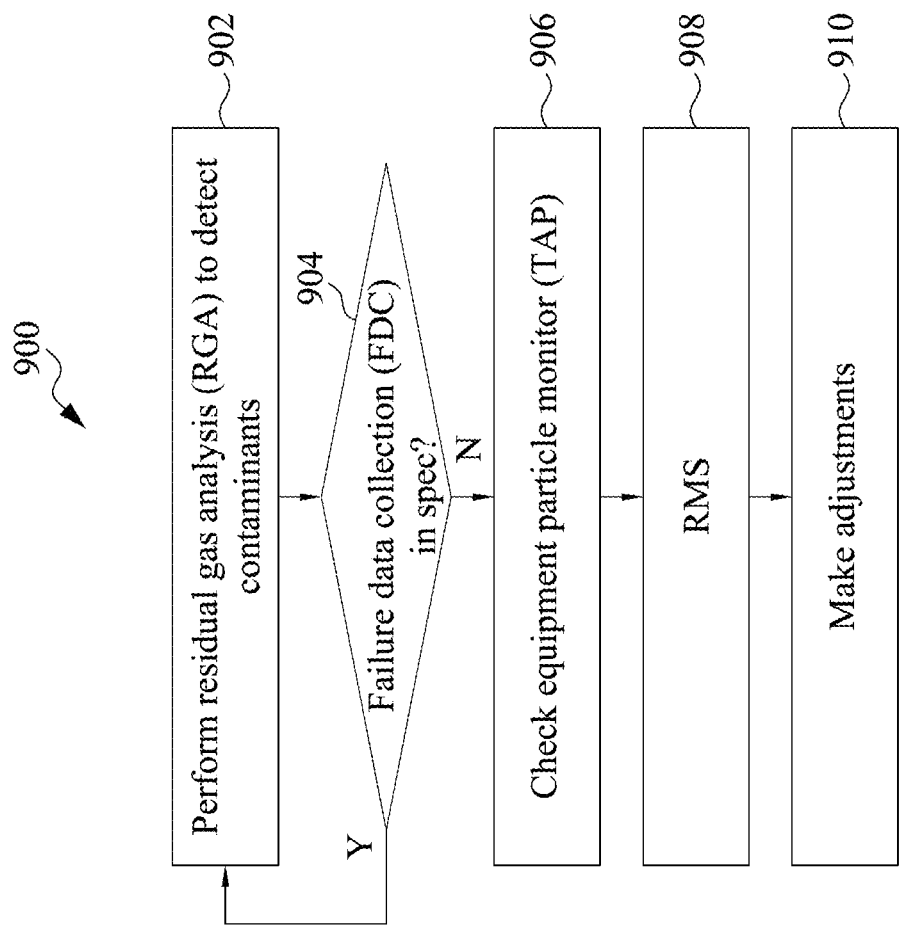
FIG. 9 is a flow diagram of a method for implementing an automatic feedback control system to reduce contamination of a multi-chamber deposition equipment set, in accordance with some embodiments.

RGA monitor 804 and throttle valves 800 and 802 can be implemented together as a feedback control system to reduce effects of contaminants 300, and to reduce contamination of buffer chamber 223 and bulk deposition chamber 224d. Using RGA monitor 804 in-situ, while wafers are in process and in transit, throttle valves 800 and 802 can be adjusted in accordance with detected contaminant levels. Operation of dual air curtain 500 can also be implemented within the feedback control system FIG. 9 illustrates an exemplary method 900 for providing real-time feedback control of hardware solutions shown in FIG. 8, during execution of steps 204 and 206 within method 200, in accordance with some embodiments. Method 900 uses data from multiple types of monitors, in combination, for controlling multiple hardware elements installed in multi-chamber deposition equipment set 220 to reduce contamination from outgassing.

At operation 902, an in-situ RGA measurement is performed to detect contaminants in buffer chamber 123.

At operation 904, a level of contaminants, e.g., contaminants having tungsten composition, determined in operation 902 is compared against a standard for failure data collection (FDC) to determine whether or not the contaminant level is within a maximum allowed limit. When the contaminant level is below a threshold value, method 200 continues and subsequent RGA measurements continue to be performed at operation 902 at prescribed time intervals.

At operation 906, when the level of contaminants determined in operation 902 exceeds the threshold value, which may indicate, for example, a burst of contaminants following opening of slit valve 308, the status of an equipment particle monitor is checked using a tool automation program (TAP) to see if there is a commensurate increase in particle trend data.

Equipment particle data may be stored on a tool server and may be used for statistical process control (SPC) of multi-chamber deposition equipment set 220. In some embodiments, SPC refers to collecting equipment particle data on test wafers and/or collecting in-line defect data on product wafers, at regular time intervals, and monitoring particle trends in real time. Using SPC, outliers in the data can be recognized to control the process. Automated statistical control, using 3-sigma or 6-sigma (double-sided) threshold values, flags anomalies in particle data trends so that action can be taken to contain product and to address equipment failures. SPC can be used to monitor either equipment sets, individual chambers, or both.

At operation 908, numerical values of the RGA and equipment monitors can be combined to determine a composite particle score. Based on the composite particle score and/or a relative contribution of various particle monitor values to the overall particle score, equipment adjustment values can be determined and, if needed, can be codified in a recipe modification summary (RMS). For example, when the composite score exceeds a predetermined threshold, further investigation can be carried out to determine whether the largest contribution is from the RGA monitor in buffer chamber 223 or from specific automated tool monitors of individual process chambers 224. If the contribution can be narrowed down to a specific chamber, e.g., process chamber 224c, maintenance can be done on the chamber to confirm the particle signature and eliminate the root cause of particles, for example, slit valve accumulation and flaking. The response to an out-of-control particle monitor may be to replace a contaminated slit valve 308. On the other hand, if the RGA monitor is the larger contributor, the root cause may be narrowed down to facilities contamination, e.g., gas lines or pumps, or to contaminants coming from the product itself, e.g., outgassing. The response to an out-of-control RGA monitor may be to adjust the operation of dual air curtain 500. One advantage of using the RGA monitor and/or the RMS monitor is that the RGA monitor operates continuously, whereas SPC data is intermittent or periodic. So, the RGA monitor may flag a problem earlier than a periodic equipment particle monitor would.

At operation 910, adjustments to hardware elements are made according to the determined equipment adjustment values. Based on one or more of an RGA value, a TAP value, and an RMS value, relative flow rates of first and second inert gases 502 and 504 of dual air curtain 500 can be modified. For example, in response to an RGA value indicating an increase in contaminants 300 within buffer chamber 223, the flow of first inert gas 502 through dual air curtain 500 can be increased. This would ensure that when wafers are transferred from process chamber 224*c*, outgassed contaminants 300 do not enter buffer chamber 223. In response to a TAP value indicating an increase in particles within process chamber 224, the flow of second inert gas 504 through dual air curtain 500 can be increased. This would ensure that while wafers are being processed in chamber 224*c*, outgassed contaminants 300 are swept into the draft of pump 302 before they can accumulate on slit valve 308.

Additionally or alternatively, settings for chamber throttle valve 800 can be adjusted, or settings for buffer chamber throttle valve 802 can be adjusted based on one or more of the RGA value, TAP value, and RMS value. For example, in response to an equipment particle monitor or TAP value increasing beyond a threshold value, throttle valves 800 and/or 802 can be opened so as to evacuate the chambers more quickly, thereby reducing the particulate load.

Method 900 can be implemented with any combination of monitors contributing to the RMS calculation in operation 908, and any combination of adjustments made at operation 910, in response to the monitor data. Any or all of the equipment adjustments made at operation 910 can be made in real time, in response to real-time measurements. Thus, processing of wafers can be adjusted based on varying contamination levels, as they occur, without sacrificing yield.

Figure 10:
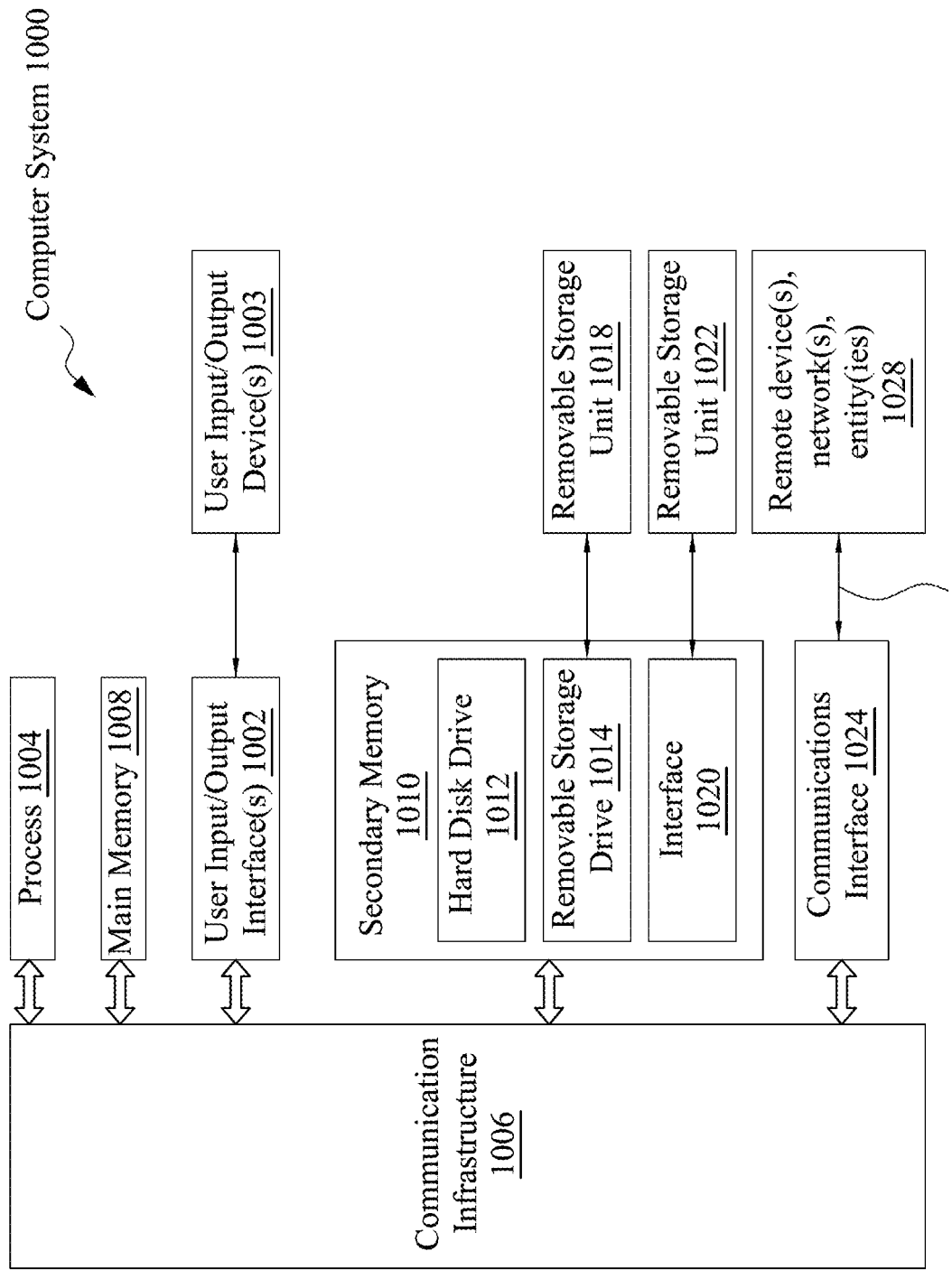
FIG. 10 is a block diagram of a computer system that can serve to implement various embodiments of the present disclosure.

FIG. 10 is an illustration of an example computer system 1000 in which various embodiments of the present disclosure can be implemented. Computer system 1000 can be any well-known computer capable of performing the functions and operations described herein. Computer system 1000 can be used, for example, to execute one or more operations in method 200 of FIG. 2 and method 900 of FIG. 9.

Computer system 1000 includes one or more processors (also called central processing units, or CPUs), such as a processor 1004. Processor 1004 is connected to a communication infrastructure or bus 1006. Computer system 1000 also includes input/output device(s) 1003, such as monitors, keyboards, pointing devices, etc., that communicate with communication infrastructure or bus 1006 through input/output interface(s) 1002. Computer system 1000 also includes a main or primary memory 1008, such as random access memory (RAM). Main memory 1008 can include one or more levels of cache. Main memory 1008 has stored therein control logic (e.g., computer software) and/or data. In some embodiments, the control logic (e.g., computer software) and/or data can include one or more of the operations described above with respect to method 200 of FIG. 2 and method 900 of FIG. 9.

Computer system 1000 can also include one or more secondary storage devices or memory 610. Secondary memory 1010 can include, for example, a hard disk drive 1012 and/or a removable storage device or drive 1014. Removable storage drive 1014 can be a floppy disk drive, a magnetic tape drive, a compact disk drive, an optical storage device, tape backup device, and/or any other storage device/drive.

Removable storage drive 1014 can interact with a removable storage unit 1018. Removable storage unit 1018 includes a computer usable or readable storage device having stored thereon computer software (control logic) and/or data. Removable storage unit 1018 can be a floppy disk, magnetic tape, compact disk, DVD, optical storage disk, and/any other computer data storage device. Removable storage drive 1014 reads from and/or writes to removable storage unit 1018 in a well-known manner.

According to some embodiments, secondary memory 1010 can include other means, instrumentalities or other approaches for allowing computer programs and/or other instructions and/or data to be accessed by computer system 1000. Such means, instrumentalities or other approaches can include, for example, a removable storage unit 1022 and an interface 1020. Examples of the removable storage unit 1022 and the interface 1020 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 1010, removable storage unit 1018, and/or removable storage unit 1022 can include one or more of the operations described above with respect to method 900 of FIG. 9.

Computer system 1000 can further include a communication or network interface 1024. Communication interface 1024 enables computer system 1000 to communicate and interact with any combination of remote devices, remote networks, remote entities, etc. (individually and collectively referenced by reference number 1028). For example, communication interface 1024 can allow computer system 1000 to communicate with remote devices 1028 over communications path 1026, which can be wired and/or wireless, and which can include any combination of LANs, WANs, the Internet, etc. Control logic and/or data can be transmitted to and from computer system 1000 via communication path 1026.

The operations in the preceding embodiments can be implemented in a wide variety of configurations and architectures. Therefore, some or all of the operations in the preceding embodiments—e.g., method 200 of FIG. 2 and method 900 of FIG. 9—can be performed in hardware, in software or both. In some embodiments, a tangible apparatus or article of manufacture comprising a tangible computer useable or readable medium having control logic (software) stored thereon is also referred to herein as a computer program product or program storage device. This includes, but is not limited to, computer system 1000, main memory 1008, secondary memory 1010 and removable storage units 1018 and 1022, as well as tangible articles of manufacture embodying any combination of the foregoing. Such control logic, when executed by one or more data processing devices (such as computer system 1000), causes such data processing devices to operate as described herein.

Semiconductor processing equipment can be configured with specialty hardware to reduce the effects of contamination that arises from the process itself, for example, from outgassing following film deposition. Such hardware can include throttle valves for regulating pump speed and efficiency, and air curtains such as a dual air curtain installed at the entrance to a process chamber. The dual air curtain can be programmable, and each of the hardware items can be controlled automatically in real time using in-situ monitoring of the process, combined with data from periodic equipment monitors that is stored on a server. A feedback control system can be used to make equipment adjustments that are tailored for certain processes, as needed.

In some embodiments, a method includes: loading a wafer into a buffer chamber; transferring the wafer from the buffer chamber to a process chamber including a slit valve, a pump, and a dual air curtain disposed between the slit valve and the pump; processing the wafer in the process chamber; and transferring the wafer from the process chamber to the buffer chamber.

In some embodiments, a system includes: a wafer station; a load lock adjoining the wafer station, the load lock configured to alternate between atmospheric pressure and vacuum; a buffer chamber adjoining the load lock; a vacuum chamber adjoining the buffer chamber and including a showerhead and a slit valve, the vacuum chamber configured to expose a wafer to a vaporized chemical from the showerhead; and a dual air curtain between the slit valve and the showerhead and configured to flow a plurality of gases.

In some embodiments, a method includes: detecting a level of contaminants in a buffer chamber using an in-situ residual gas analyzer (RGA) monitor; collecting data from a tool server; analyzing the level of contaminants together with the data from the tool server to determine one or more adjustment values; and in response to the level of contaminants being above a first threshold, adjust relative flow rates of different inert gases flowing through a dual air curtain based on the one or more adjustment values.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
   a wafer station;
   a load lock adjoining the wafer station, the load lock configured to alternate between atmospheric pressure and vacuum;
   a buffer chamber adjoining the load lock;
   a vacuum chamber adjoining the buffer chamber and comprising a showerhead and a slit valve, the vacuum chamber configured to expose a wafer to gas phase reactants from the showerhead; and
   a dual air curtain between the slit valve and the showerhead and configured to flow a plurality of gases.

2. The system of claim 1, wherein the vacuum chamber further comprises a chuck.

3. The system of claim 1, wherein the vacuum chamber is configured to perform one or more of a chemical vapor deposition (CVD) process, a plasma enhanced chemical vapor deposition (PECVD) process, an atomic layer deposition (ALD) process, and a spatial atomic layer deposition (SALD) process.

4. The system of claim 1, wherein the plurality of gases includes one or more of argon, nitrogen, oxygen, and helium.

5. The system of claim 1, further comprising a chamber throttle valve configured to regulate a pressure of the vacuum chamber.

6. The system of claim 1, further comprising a buffer chamber throttle valve configured to regulate a pressure of the buffer chamber.

7. The system of claim 1, further comprising a residual gas analysis (RGA) monitor configured to measure composition of residual gases in one or more of the vacuum chamber and the buffer chamber.

8. The system of claim 7, further comprising a controller configured to regulate one or more of gas pressure and gas flow based on measurements performed by the RGA monitor.

9. The system of claim 8, wherein the controller is configured to regulate the one or more of gas pressure and gas flow based on one or more of a failure data collection (FDC) monitor, data stored on a tool server, and a statistical process control (SPC) monitor.

10. The system of claim 8, wherein the controller is configured to control the dual air curtain to:
    flow a first gas while the wafer is exposed to the gas phase reactants in the vacuum chamber and the slit valve is closed; and
    flow a second gas while the wafer is being transferred out of the vacuum chamber and the slit valve is open.

* * * * *